United States Patent [19]

Fox

[11] Patent Number: 4,769,605
[45] Date of Patent: Sep. 6, 1988

[54] NETWORK TO CANCEL COUPLING BETWEEN CHANNELS OF QUADRATURE ANTENNA COIL ASSEMBLY IN A MAGNETIC RESONANCE IMAGING SYSTEM

[75] Inventor: Timothy R. Fox, Chicago, Ill.

[73] Assignee: Kabushiki Kaisha Toshiba, Kanagawa, Japan

[21] Appl. No.: 935,001

[22] Filed: Nov. 26, 1986

[51] Int. Cl.⁴ .............................................. G01R 33/20
[52] U.S. Cl. .................................................... 324/322
[58] Field of Search ............... 324/322, 311, 305, 318, 324/307; 307/89, 90; 333/12, 24 C, 139; 328/215, 216, 217; 343/741, 742, 743, 744, 850

[56] References Cited

U.S. PATENT DOCUMENTS 3,603,871 9/1971 Caunter et al. ...................... 324/322
4,695,801 9/1987 Arakawa et al. .................... 324/322

OTHER PUBLICATIONS

Blume, R. L., "u-Mode Balancing Method for Crossed-Coil Nuclear Magnetic Resonance Rf Head," Rev. Sci. Instr. 33(2), Dec. 1962.
Journal of Physics E, vol. 8, No. 8, pp. 632–633 (Aug. 1975), R. R. Lembo, V. J. Kowalewski "Leakage Balance System for Crossed Coil NMR Probes".
The Review of Scientific Instruments, vol. 19, No. 7, pp. 435–439, Martin E. Packard, "A Proton-Controlled Magnetic Field Regulator", Jul. 1948.

Primary Examiner—Stewart J. Levy
Assistant Examiner—Lawrence Fess
Attorney, Agent, or Firm—Finnegan, Henderson, Farabow, Garrett and Dunner

[57] ABSTRACT

In a quadrature antenna coil assembly of a magnetic resonance imaging system, the antenna coil assembly having a first receiver coil and a second receiver coil and having external coupling between the first and second receiver coils, a coupling cancellation network has a first set of terminals connected across the first receiver coil, a second set of terminals connected across the second receiver coil, and circuitry, connected between the first and second terminal sets, for generating additional coupling between the first and second receiver coils in opposite polarity and equal magnitude to the external coupling to cancel the external coupling.

13 Claims, 3 Drawing Sheets

NETWORK TO CANCEL COUPLING BETWEEN CHANNELS OF QUADRATURE ANTENNA COIL ASSEMBLY IN A MAGNETIC RESONANCE IMAGING SYSTEM

BACKGROUND OF THE INVENTION

1. Field Of The Invention

This invention relates generally to the field of magnetic resonance imaging systems and more specifically to a quadrature antenna coil assembly in a magnetic resonance imaging system which assembly contains a coupling cancellation network to cancel undesired coupling between the two channels of a quadrature antenna assembly.

2. Description Of Related Art

Magnetic resonance imaging ("MRI"), also known as nuclear magnetic resonance ("NMR") imaging, has become a valuable tool as a safe, noninvasive means for obtaining information in the form of images of objects under examination. For example, MRI can be used as a medical diagnostic tool by providing images of selected portions of the human body without the use of X-ray photography. In such an MRI system, a quadrature antenna coil assembly can be used. One such antenna assembly is shown in FIG. 1.

In FIG. 1, MRI antenna coil assembly 10 includes two perpendicularly oriented receiver coils $L_x$ ($L_{x1}$, $L_{x2}$) and $L_y$ ($L_{y1}$, $L_{y2}$) to sense the oscillating radio frequency ("RF") magnetic fields generated from the precessing protons P of the object being examined in the antenna coil assembly volume. The RF magnetic fields are sensed along two axes X and Y. These two axes are perpendicular to the Z axis of the system, which axis is in the direction of the static magnetic field used in the MRI system. Receiver coil $L_x$ is tuned with a parallel capacitor $C_x$ comprised of capacitors $C_{x1}$ and $C_{x2}$ where $L_x$, $C_x$ forms a resonant circuit. Similarly, receiver coil $L_y$ is tuned by parallel capacitor $C_y$ comprising capacitors $C_{y1}$ and $C_{y2}$ where $L_y$, $C_y$ also forms a resonant circuit. Each receiver coil is tuned to resonate at the appropriate signal frequency. In the typical quadrature antenna coil assembly shown in FIG. 1, the signals received in the X axis and in the Y axis are preamplified through X amplifier 11 and Y amplifier 12, respectively, and fed into quadrature combiner 13 as the X and Y channels of the system. Quadrature combiner 13 provides output signal $S_o$ which is processed by the remainder of the MRI system (not illustrated) to provide an intelligible image of the selected portion of the object being examined.

Each channel's receiver coil is similar to a typical linearly-polarized coil commonly used for MRI receiving. In the ideal situation, each receiver coil should show a high degree of linear spatial polarization, with a large ratio between the maximum and minimum response to a linearly-polarized field. Also, the maxima and minima on one receiver coil should be rotated by 90° with respect to the maxima and minima on the other receiver coil. Combining the outputs from the X and Y channels in a quadrature combiner would, in such a situation, show an ideal response to a circularly-polarized field, such as from the precessing spins of the protons P of the body being examined by the MRI system. In such an ideal situation, there would be no inductive coupling between the two receiver coils. In practice, however, the use of an MRI antenna assembly, such as assembly 10, suffers from undesigned and undesired coupling between the X and Y channels. These coupling mechanisms include small mutual inductances between the coils, capacitance from one coil to the other, and coupling through other circuits, such as other coils, in the MRI system.

Since the resonant circuits $L_x$, $C_x$ and $L_y$, $C_y$ of MRI antenna assembly 10 are high Q circuits, the coupling between the two receiver coils in the quadrature system is greatly magnified. For proper imaging, the requirements of the antenna system are very strict, and a small coupling coefficient factor k will, therefore, lead to poor quadrature imaging results.

As an example of the high Q coupling magnification problem, a three-turn receiver coil set may have a coupling factor of the absolute value $|k|$ between the two receiver coils of less than 1%. However, since the Q is greater than 200 for the circuit, the magnified coupling $|k \cdot Q|$ is greater than 1. For proper quadrature receiving, it has been determined that the magnified coupling $|k \cdot Q|$ must be less than 0.1. Thus, the coupling factor $|k|$ must be reduced to less than $5 \times 10^{-4}$.

Attempts have been made to reduce the unwanted coupling between the receiver coils of MRI antenna assemblies. Such attempts include, for example, shielding the coils from each other. Those attempts, however, have had difficulty in reducing the coupling sufficiently to provide clear and, thus, more useful quadrature imaging. Additionally, such shielding may require additional manufacturing steps, can be difficult to install, and is an unwanted, additional expense.

From the foregoing considerations, it should be apparent that there is a great need for an improved MRI antenna assembly in which the problems of unwanted coupling between receiver coils is eliminated.

It is, thus, an intention of the invention to provide a network for use in an MRI antenna assembly to eliminate the undesired coupling between the receiver coils.

Another intention of the invention is to eliminate the undesired coupling in an MRI antenna assembly by a simple, easy to adjust, reliable, stable, and inexpensive circuit.

Still another intention of the invention is to provide a coupling cancellation network to an MRI antenna assembly in which the undesired coupling between the two receiver coils is cancelled by the creation of additional coupling between the two receiver coils which is the opposite polarity of the undesired coupling and in equal magnitude to the undesired coupling by providing a neutralization coupling factor k' to cancel the assembly's normal coupling factor k.

Yet another intention of the invention is to allow for the additional coupling to be easily adjustable.

A further intention of the invention is to provide circuitry for the additional coupling network to reverse the polarity of the additional coupling as needed.

Other intentions and features of the invention will further become apparent with reference to the accompanying drawings and detailed description of the invention.

SUMMARY OF THE INVENTION

To achieve the foregoing intentions and in accordance with the purpose of the invention, as embodied and broadly described herein, in a quadrature antenna coil assembly of a magnetic resonance imaging system, the antenna coil assembly having a first receiver coil and a second receiver coil and having external coupling between the first and second receiver coils, a coupling cancellation network comprises a first set of terminals connected across the first receiver coil and having a first terminal and a second terminal; a second set of terminals connected across the second receiver coil and having a first terminal and a second terminal; and means, connected between the first and second terminal sets, for generating additional coupling between the first and second receiver coils in opposite polarity and equal magnitude to the external coupling.

The additional coupling generating means is, in one embodiment, an H-network having two first capacitors in series between the first terminals of the first and second sets of terminals, two second capacitors in series between the second terminals of the first and second sets of terminals, and a variable capacitor connected between the common connection of the two first capacitors and the common connection of the two second capacitors. The coupling cancellation network also can have means, such as a double-pole double-throw switch or two ganged single-pole double-throw switches, for reversing the connection of the first and second terminals of the first set of terminals to the first receiver coil.

The additional coupling generating means comprises, in a second embodiment, means for generating an adjustable coupling of a first polarity and means for generating a fixed coupling of a second polarity, wherein the adjustable coupling generating means and the fixed coupling generating means are connected to combine the algebraic sum of the adjustable and the fixed generated coupling for producing the additional coupling at the first and second sets of terminals that can be varied over a range from negative coupling to positive coupling. The adjustable coupling generating means can be a first H-network having two first capacitors in series with the first terminal of the first set of terminals and the second terminal of the second set of terminals, two second capacitors in series between the second terminal of the first set of terminals and the first terminal of the second set of terminals, and a variable capacitor connected between the common connection of the two first capacitors and the common connection of the two second capacitors. The fixed coupling generating means can be a second H-network having two first capacitors in series between the first terminals of the first and second sets of terminals, two second capacitors in series between the second terminals of the first and second sets of terminals, and a fixed capacitor connected between the common connection of the two first capacitors and the common connection of the two second capacitors.

BRIEF DESCRIPTION OF THE DRAWINGS

The accompanying drawings, which are incorporated in and constitute part of this specification, illustrate embodiments of the invention and, together with the description, serve to explain the principles of the invention.

Of the drawings.

DESCRIPTION OF THE PREFERRED EMBODIMENTS

Reference will now be made in detail to the present preferred embodiments of the invention, examples of which are illustrated in the accompanying drawings.

Figure 2:
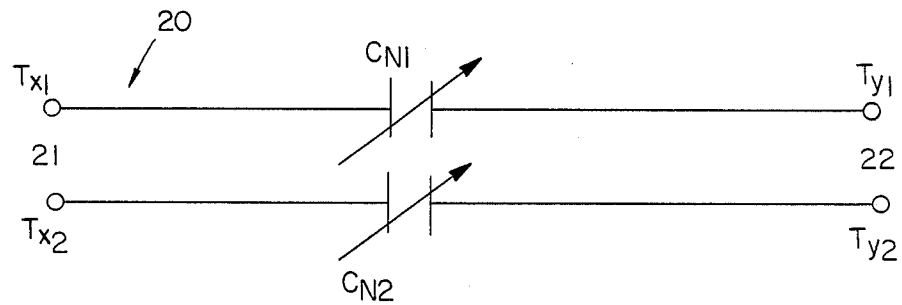
FIG. 2 is a schematic of one preferred embodiment of the coupling cancellation network invention.

The Basic Network of FIG. 2

Figure 1:
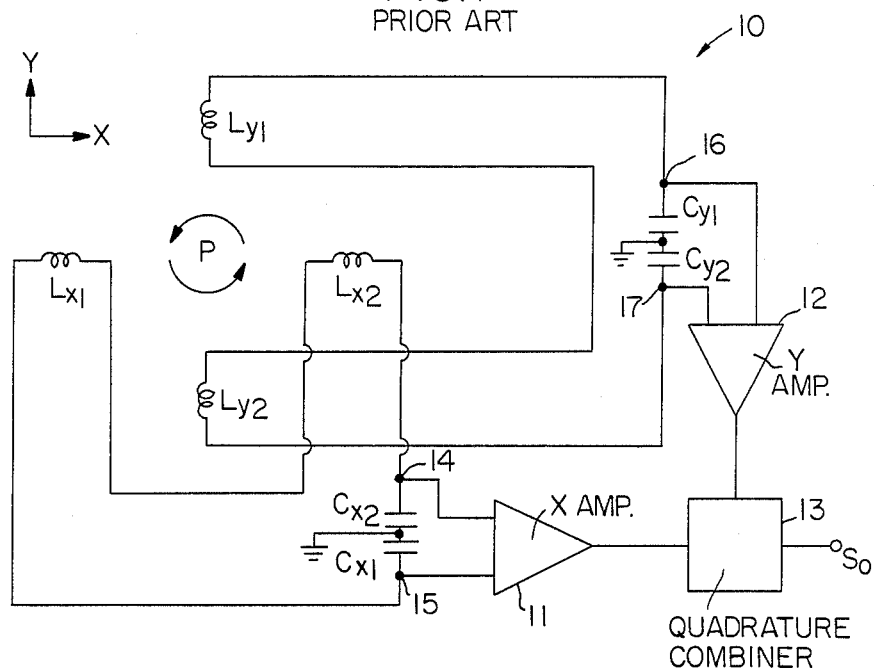
FIG. 1 is a simplified drawing of a conventional quadrature MRI antenna coil assembly to which the invention is connected to improve quadrature imaging.

Referring now to the drawings, wherein like reference characters designate like or corresponding parts throughout the several drawings, there is shown in FIG. 1 an MRI antenna coil assembly 10 as described above. Antenna coil assembly 10 has a magnified coupling equal to $|k \cdot Q|$, not illustrated, where k is the coupling coefficient or factor between the two receiver coils $L_x$, $L_y$ and Q is the quality factor of the resonant circuit. (For the purposes of this discussion, while the Q for each channel in practice is quite close but not identical, the Q's are treated as being equal.) This coupling factor is the undesired coupling (also referred to here as external coupling) which is to be eliminated for improved quadrature receiving.

The invention provides a network to cancel the undesired, external coupling. The coupling cancellation network creates a neutralization coupling coefficient or factor k' to cancel the measured, undesired coupling factor k of the receiver coils. By acting on the coupling factor k directly, the coupling cancellation network does not require re-adjustment for coupling cancellation when the Q and the resonant frequency of the MRI antenna system change due to load changes caused when different objects or different portions of the same object are examined. A method for measuring coupling factor k is described below.

There is shown in FIG. 2 a most basic preferred embodiment of the invention. As shown in FIG. 2, coupling cancellation network 20 comprises a first set of terminals 21 having a first terminal $T_{x1}$ and a second terminal $T_{x2}$; a second set of terminals 22 having a first terminal $T_{y1}$ and a second terminal $T_{y2}$; and means, connected between the first and second terminal sets 21, 22, for generating additional coupling between the first and second receiver coils $L_x$, $L_y$ of antenna coil assembly 10 in opposite polarity and equal magnitude to the external coupling of antenna coil assembly 10.

An example of the additional coupling generating means, as illustrated in FIG. 2, comprises a first capacitance $C_{N1}$ connected between terminals $T_{x1}$ and $T_{y1}$ and a second capacitance $C_{N2}$ connected between terminals $T_{x2}$ and $T_{y2}$. As shown in FIG. 2, the neutralization capacitors $C_{N1}$, $C_{N2}$ can be variable capacitors to adjust neutralization coupling factor k' to be equal in magnitude to the undesired coupling factor k. The first and second capacitance $C_{N1}$, $C_{N2}$ must be equal to balance the network; thus, a change to $C_{N1}$ must be identical in $C_{N2}$ and vice versa. The component value calculations are discussed below.

Coupling cancellation network 20 is connected between the two receiver coils $L_x$, $L_y$ of MRI antenna coil assembly 10. For example, first terminal set 21 is connected across receiver coil $L_x$ at points 14, 15 in FIG. 1, and second terminal set 22 is connected across receiver coil $L_y$ at points 16, 17 of FIG. 1. The connections can be reversed with set 21 connected across coil $L_y$ and set 22 connected across coil $L_x$. Connections of terminals $T_{x1}$ and $T_{x2}$ can also be reversed at points 14, 15, for example, when accompanied by the reversal of the connections to terminals $T_{y1}$ and $T_{y2}$ at points 16, 17.

Neutralization capacitors $C_{N1}$, $C_{N2}$ of coupling cancellation network 20 in FIG. 2 couple a small fraction of the voltage across tuning capacitor $C_x$ into tuning capacitor $C_y$ of antenna coil assembly 10 and also couple a small fraction of the voltage across tuning capacitor $C_y$ into tuning capacitor $C_x$ thereby generating the desired additional coupling between receiver coils $L_x$, $L_y$. Specifically, the two added neutralization capacitors $C_{N1}$, and $C_{N2}$ form a voltage divider with tuning capacitors $C_{y1}$, $C_{y2}$. This adds a small voltage $V_y'$ in series with the Y resonant circuit $L_y$, $C_y$, that is, the Y channel, given approximately by:

$$\frac{|V_y'|}{|V_x|} = |k'| = \frac{C_N}{C_N + C_y}, \quad (1)$$

where $V_x$ is the voltage across tuning capacitors $C_{x1}$, $C_{x2}$ in FIG. 1 and $$C_N = \frac{C_{N1} \cdot C_{N2}}{C_{N1} + C_{N2}} \text{ and } C_y = \frac{C_{y1} \cdot C_{y2}}{C_{y1} + C_{y2}} \quad (2)$$

In antenna coil assembly 10 of FIG. 1, both resonant circuits are symmetric and balanced with respect to ground. Therefore, $$C_N = \frac{C_{N1}}{2} \text{ and } C_y = \frac{C_{y1}}{2} = C_x = \frac{C_{x1}}{2}. \quad (3)$$

Neutralization capacitors $C_{N1}$, $C_{N2}$ the other direction, adding a voltage $V_x'$ in series with the X channel, given by $$|V_x'| = |k'| \cdot |V_y|. \quad (4)$$

Due to the symmetry in balance of both the X and Y channel circuits, the neutralization coupling factors $|k'|$ will be equal.

By using the balanced circuit in antenna coil assembly 10 where the tuning capacitance is split into two equal capacitors $C_{x1}$, $C_{x2}$ and $C_{y1}$, $C_{y2}$ in series, the voltages with respect to ground at the two ends of each resonant circuit are equal in amplitude and opposite in polarity. This allows coupling with a choice of polarity to be added from one circuit to the other.

Since the polarity of the original unwanted coupling is not necessarily known before adding the coupling cancellation network, the neutralization polarity may need to be reversed. Also, the additional coupling must be the correct magnitude to cancel the undesired external coupling. Thus, coupling cancellation network 20 must be easily adjustable. The reversibility of the additional coupling's polarity and the adjustability of its magnitude is described later.

With the introduction of coupling cancellation network 20 of FIG. 2 into MRI antenna coil assembly 10 of FIG. 1 and after network 20 has been adjusted to generate neutralization coupling factor $k'$ in opposite polarity and equal magnitude to undesired external coupling factor $k$ and, thus, cancel the external coupling, MRI antenna coil assembly 10 will, in effect, be a pair of isolated receiver coil circuits. The voltage on one circuit will be unaffected by the current through the other circuit. Each receiver coil will show a high degree of linear spatial polarization, with a large ratio between the maximum and minimum response to a linearly-polarized field. Additionally, the maxima and minima on one coil will be rotated by 90° about the Z axis of the system with respect to the maxima and minima on the other receiver coil. The combining of the outputs from receiver coils $L_x$, $L_y$ in quadrature combiner 13 will, therefore, produce an output signal $S_o$ which can be processed to produce a good response to a circularly-polarized field, such as from the precessing spins of an MRI system.

Figure 4:
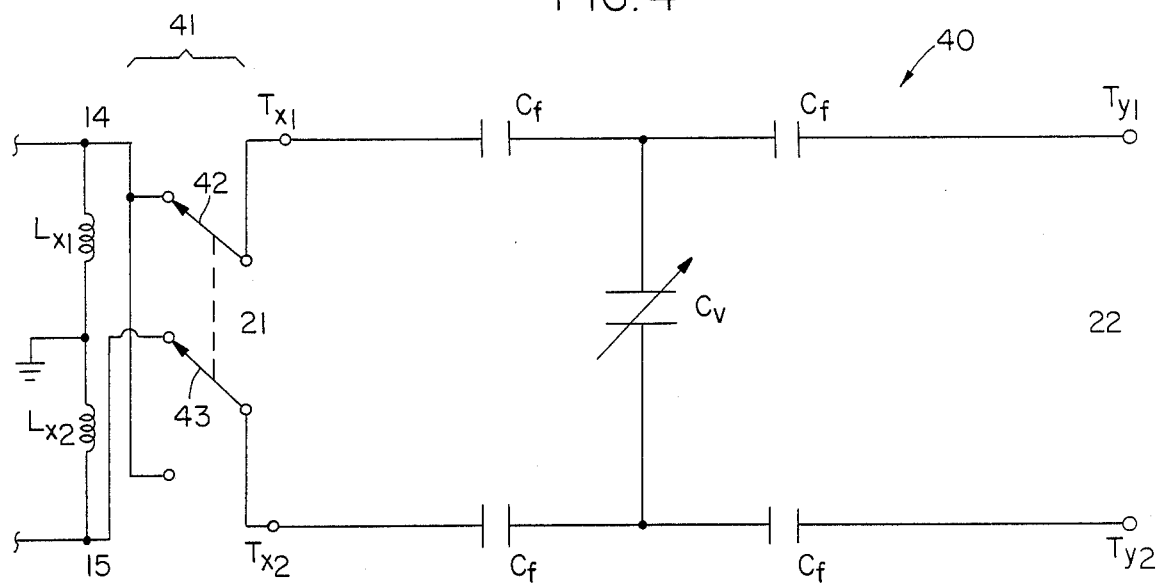
FIG. 4 is a schematic of a second preferred embodiment of the coupling cancellation network invention.

The Single H-Network of FIG. 4

In practice, the circuit parameters of coupling cancellation network 20, that is, the values of neutralization capacitors $C_{N1}$ and $C_{N2}$, are very small and can be less than 1 pF. Additionally, the two neutralization capacitors must be changed together to adjust properly the coupling cancellation network, which is difficult for such small capacitors. To overcome those practical difficulties, a second preferred embodiment of the invention was created to allow the use of larger capacitances and to allow neutralization adjustment with only one variable capacitor.

Figure 3A:
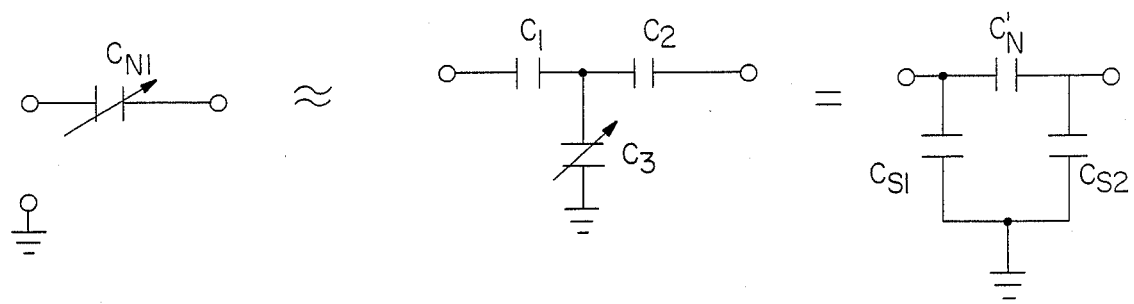
FIGS. 3A, 3B, and 3C are schematics of various circuits used to assist in the written description of the invention.

As shown in FIG. 3A, small neutralization capacitor $C_{N1}$ is replaced by a "Y" connection of three larger capacitors $C_1$, $C_2$, $C_3$ in which the effective value of capacitor $C_{N1}$ is given by:

$$C_{N1} = C_{N'} = \frac{C_1 \cdot C_2}{C_1 + C_2 + C_3}. \quad (5)$$

Now letting $C_1 = C_2 = C_f$ be fixed capacitors and $C_3 = 2 \cdot C_v$ be a variable capacitance, $$C_{N1} = C_{N'} = \frac{C_f^2}{2 \cdot C_f + 2 \cdot C_v} = \frac{C_f}{2} \cdot \frac{1}{1 + (C_v/C_f)} \quad (6)$$

Since $C_v$ is greater than zero, the effective neutralization capacitance $C_{N1}$ is less than $C_f/2$.

Figure 3B:
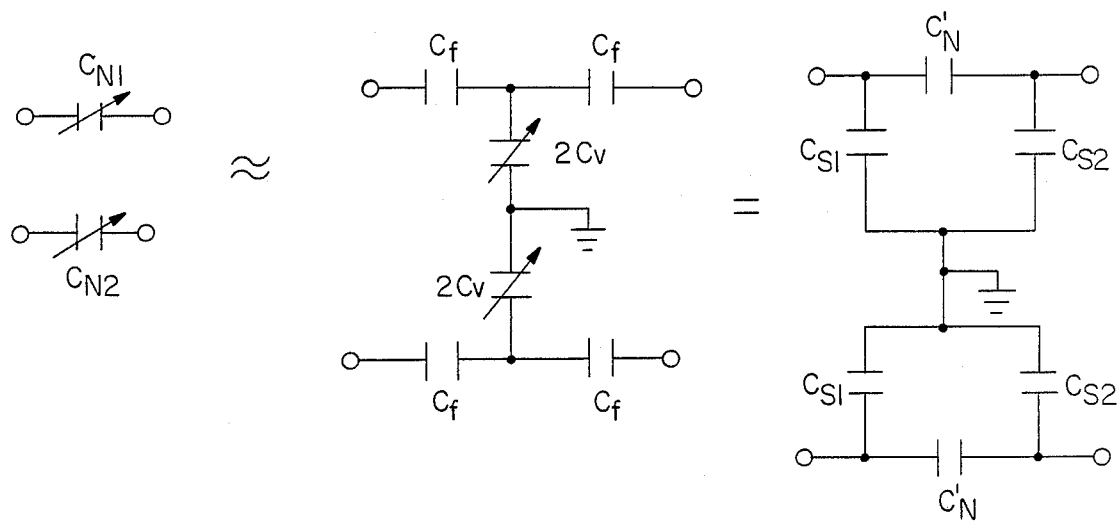

To balance the "Y" network of FIG. 3A, a mirror image "Y" network is added creating the H-network shown in FIG. 3B. This addition provides the two small neutralization capacitors $C_{N1}$, $C_{N2}$ required between the balanced resonant circuits $L_x$, $C_x$ and $L_y$, $C_y$. Since the voltages applied to the neutralization network are balanced with respect to ground and if the capacitor values are symmetric as in FIG. 3B so that $C_{N1} = C_{N2} = C_{N'}$, no current flows in the ground wire at the center of the "H". Thus, the ground can be disconnected and only one capacitor $C_v$ can be used in the middle position of the H-network as shown in the left side of FIG. 3C. Adjusting the single variable capacitor $C_v$ will vary both of the two effective neutralization capacitances $C_{N1}$, $C_{N2}$ together and, thus, will adjust neutralization coupling factor $k'$. Of course, $C_f$ can be variable and $C_v$ fixed to adjust $k'$.

Figure 3C:
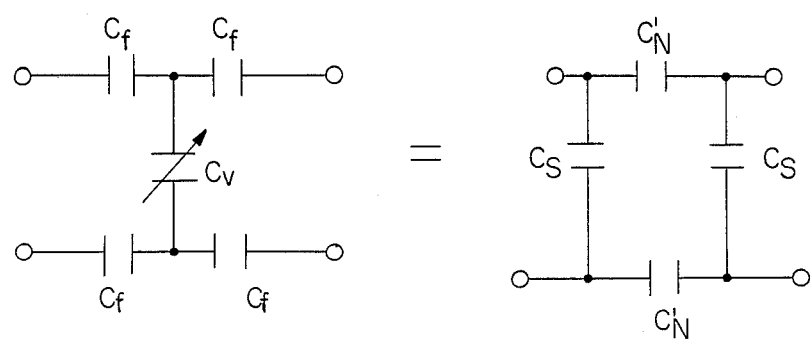

The use of the H-network shown in FIG. 3C and in FIG. 4 adds additional shunt capacitance across each tuning capacitor $C_x$, $C_y$. The shunt capacitance is shown by using a Y-delta transformation as illustrated in the right-hand circuits of FIGS. 3A, 3B and 3C, where $C_{s1} = C_{s2} = 2 \cdot C_s$. As discussed below, shunt capacitors $C_s$ create a limit with respect to how large the fixed capacitors $C_f$ can be since the total tuning capacitance, including the shunt capacitance, is determined by the coil inductance.

As discussed above, the polarity of the original unwanted coupling before adding a coupling cancelling network, such as network 20 of FIG. 2 and network 40 of FIG. 4, is not necessarily known. Thus, means for reversing the polarity of the additional, neutralization coupling may be necessary. One such means is shown in FIG. 4 as element 41. Reversing means 41 allows the reversal connection of first and second terminals $T_{x1}$, $T_{x2}$ of the first set of terminals 21 to receiver coil $L_x$. Reversing means y1 can be, among other things, a pair of single-pole double-throw switches 42, 43 if desired a double-pole double-throw switch. The reversing means can be used across terminals $T_{y1}$, $T_{y2}$ of second terminal set 22 instead to reverse the connections across receiver coil $L_y$.

Figure 5:
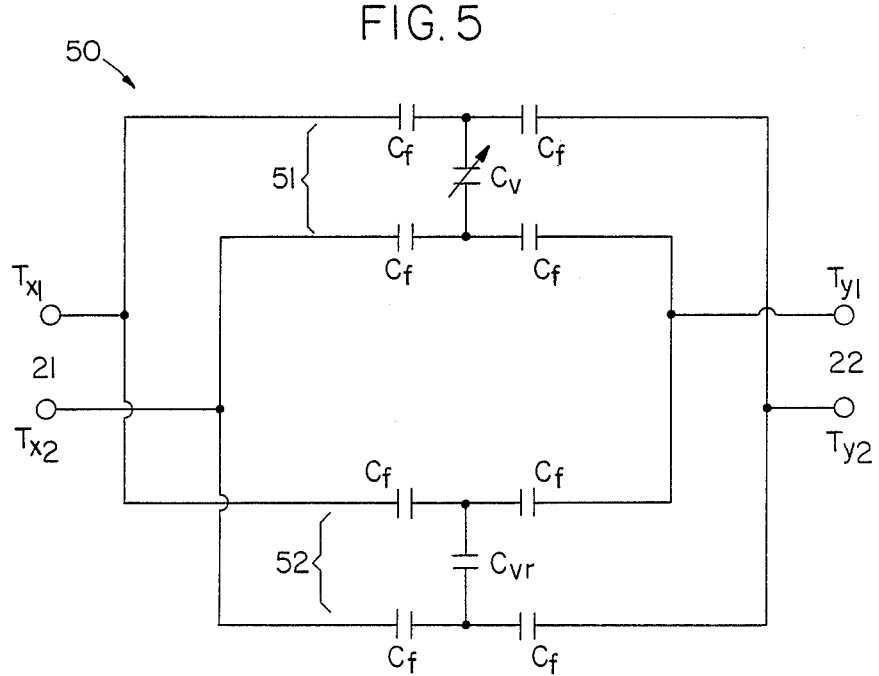
FIG. 5 is a schematic of a third preferred embodiment of the coupling cancellation network invention.

The Double H-Network of FIG. 5

Another way to provide a reversible and adjustable cancellation network is shown by the preferred embodiment illustrated in FIG. 5. In FIG. 5, additional coupling generating means 50 comprises means for generating an adjustable coupling of a first polarity, such as variable H-network 51, and means for generating a fixed coupling of a second polarity, such as fixed H-network 52. The two H-networks 51, 52 are combined by reversing connections to one H-network with respect to the other H-network as shown in FIG. 5. Both H-networks can, of course, be variable if desired.

Since the coupling factor $|k|$ must be small, the coupling cancellation network is only a small perturbation on the capacitive part of both the X and Y resonant circuits. Thus, the combination of the two H-networks 51, 52 can be treated as the algebraic sum of the individual effects of each H-network. By combining a fixed H-network of one polarity with a variable H-network of the other polarity, continuous adjustment from negative coupling to zero coupling to positive coupling is achieved.

In the coupling cancellation network of FIG. 5, variable H-network 51 consists of four capacitors $C_f$ and one variable capacitor $C_v$. Fixed H-network 52 comprises four fixed capacitors $C_f$ and one fixed capacitor $C_{vr}$ connected as shown in FIG. 5. If the coupling factors $k_v$ of variable network 51 and $k_f$ of fixed network 52 are related by:

$$|k_v(max)| > |k_f| > |k_v(min)| \qquad (7)$$

where $k_v$ and $k_f$ are of opposite sign, the total coupling factor k' of cancellation network 50 in FIG. 5 can be varied from positive to zero to negative by adjusting only the variable capacitor $C_v$ on the variable H-network 51.

To obtain equal values of maximum negative and maximum positive coupling factors for the total network 50, $$|k_f| = \frac{|k_v(max)| + |k_v(min)|}{2}, \qquad (8)$$

where $k_v$ and $k_f$ are determined for each of the two H-networks 51, 52.

Measuring The External Coupling Factor k

To calculate the component values for a practical coupling cancellation network, the undesired, external coupling factor k between the resonant circuits of the X and Y receiver coils in the MRI antenna coil assembly must be ascertained.

To assist in determining the external coupling factor k and for other useful purposes, such as tuning the quadrature receiver coils, a rotatable test source comprising a crystal oscillator circuit called a "Cricket" is used. The rotating Cricket can be a one-transistor crystal oscillator constructed in a well shielded box, such as an aluminum box, and powered by an internal battery such as a 3 volt camera battery. The transistor emitter current flows through an external shielded loop connected to the box through a miniature coaxial connector. For example, an external 25-mm loop of subminiature coax can be used. Electrostatic shielding is maintained by the coax shield while a small gap in the outer shield allows a magnetic field inside the loop. The Cricket generates an oscillating magnetic dipole perpendicular to the plane of the loop. The resulting field is linearly polarized.

The Cricket is placed at the center of the MRI antenna coil assembly volume in which the object to be examined is normally located, and the small oscillator is manually rotated around the Z axis to provide a slowly rotating polarization of the induced magnetic field.

A properly positioned Cricket acts as an ideal linearly-polarized source. If the Cricket is slowly rotated by 360° about the Z axis, two maximum and two minimum voltage responses are output for each of the channels X and Y. With no coupling between the two channels, the minimum response on one channel will be almost zero and will occur when the dipole of the Cricket is pointing in the direction of the other channel which is experiencing a maximum response. If, however, there is a weak coupling between the channels, there will be a measurable signal in channel Y when the source is aligned with channel X. The ratio between these two responses is approximately:

$$\frac{|V_x(max)|}{|V_y(min)|} = |k \cdot Q|. \qquad (9)$$

The approximation is helpful if $|k \cdot Q|$ is small; however, strong coupling, for example $k \cdot Q \geq \frac{1}{2}$, gives results that are difficult to interpret. For example, where the coupling is too large for measuring, the minimum angular positions for channels X and Y are close, and the two receiver coils appear to act as one single coil. In this case, the effective coupling must be reduced.

Since k is being determined, to reduce strong magnified coupling, $k \cdot Q$, must be reduced. Where the self-inductance $L_0$ of receiver coils is known, to reduce Q a suitable carbon resistor is connected in parallel with each receiver coil to reduce the circuit Q to a low value of approximately 10 to 30. For a parallel resistance $R_p$, the loaded Q will be approximately:

$$Q = R_p/(2\pi f_o L_0), \qquad (10)$$

where $f_o$ is the operating frequency.

The self-inductance $L_0$ must be the self-inductance measured in the gantry of the MRI system, corrected for the distributed capacitance of the coil. As an alternative to an accurate $L_0$ measurement, the bandwidth of the coil and preamplifier, including the parallel resistor, can be measured by exciting the circuit through a loosely-coupled probe coil. This measured Q includes the loading from the parallel resistor and the amplifier tuning network.

After reducing Q to achieve a very undercoupled response (for example, $|k \cdot Q| > \frac{1}{4}$) k can be determined by rotating the Cricket around the coil axis and measuring the maximum and minimum responses on both channels X and Y. At low Q, these responses are weaker than at high Q but should still be measurable. If the signals are too low, then the oscillator current can be increased. The maxima and minima will be at locations 90° apart for the undercoupled response. If not, the Q may be reduced more by using a smaller parallel resistor.

$$\frac{|V_y(\max)|}{|V_x(\min)|}$$

is greater than approximately 4, the coupling factor $|k|$ is calculated from:

$$|k| \simeq (1/Q) \cdot \frac{|V_x(\min)|}{|V_y(\max)|} . \tag{11}$$

The two voltages $V_y(\max)$ and $V_x(\min)$ are measured at the same rotational position of the Cricket but on different channels. Since the coupling is not totally symmetric, there may be a difference between the $V_y(\max)/V_x(\min)$ and $V_x(\max)/V_y(\min)$. For the neutralization design, the larger coupling of the two cases is used as discussed below. Additionally, the two values for the same polarization ratio, that is, $V_y(\max)/V_x(\min)$ or $V_x(\max)/V_y(\min)$, measured with the Cricket rotated by 180° should be approximately equal. However, if they are not approximately equal, then the Cricket was rotated around an off-centered axis.

The value of k measured by the above technique will be valid when the added resistor is removed and the circuit has a high Q value again.

Component Value Calculations

As described above, when determining the undesired coupling factor k, typically the coupling factor measured from channel X to channel Y will not agree with the coupling factor measured in the other direction. Thus, for neutralization design the larger of the two values is selected. That measured coupling factor k is then increased by a safety factor to give a design value for neutralization coupling factor k'. (Note that the absolute values of measured coupling factor k and neutralization factor k' are considered here. For the proper polarity of neutralization factor k', the connections of coupling cancellation network 20 of FIG. 2 and 40 of FIG. 4 can be reversed as needed by reversing means 41, for example, in FIG. 4.)

From above (equation (1)), for the basic coupling cancellation network 20 shown in FIG. 2, $$|k'| = C_N/C_N + C_y, \tag{12}$$

where $C_N = C_{N1}/2 = C_{N2}/2$ and $C_y$ is the total capacitance required to resonate the inductance of coil $L_y$, including the self-capacitance of receiver coil $L_y$.

The neutralization capacitance for H-network 40 shown in FIG. 4 is given by equation (6)

$$C_{N1} = C_{N2} = C_{N'} = \frac{C_f}{2} \cdot \frac{1}{1 + (C_v/C_f)} , \tag{13}$$

As also discussed above, there is a shunt capacitance $C_s$ on each side of the H-network as shown in the right-hand circuit of FIG. 3C. Shunt capacitance $C_s$ affects the tuning of antenna coil assembly 10 of FIG. 1. The total added tuning capacitance on each tuned resonant circuit is approximately:

$$C_t' = C_s + C_N. \tag{14}$$

The Y-delta transformation theorem gives the following value for the equivalent shunt capacitance:

$$C_s = \frac{1}{2} \cdot \frac{C_f \cdot (2 \cdot C_v)}{C_f + C_f + 2 \cdot C_v} = \frac{C_v}{2} \cdot \frac{1}{1 + (C_v/C_f)} . \tag{15}$$

The above equations (12), (13), (14) and (15) allow for the calculation of both the neutralization coefficient k' and the added tuning capacitance $C_t'$.

One method of computing the values of k' and $C_t'$ is to use a range of fixed capacitance $C_f$ and trimmer capacitance $C_v$. A simple computer program can be created to calculate various values from the above equations. The total tuning capacitance $C_y$ required to resonate the receiver coil $L_y$ is already known. Also, the range on the trimmer capacitor $C_v$ is fixed by the available trimmer capacitor unit itself. For example, an E. F. Johnson air trimmer can be used which has a range of 2.4 to 24.5 pF.

One meaningful set of data is to generate a two-dimensional array of values, with five $C_v$ values between $C_v(\min)$ and $C_v(\max)$ across the top of the array and a range of fixed capacitor values $C_f$ down the left edge. The capacitance values on both edges are in a geometric progression. For each pair of $C_f$, $C_v$ values, $C_t'$ is calculated, modified tuning capacitance $C_y'$ equaling $C_y - C_t'$ is calculated, and then the resulting neutralization coefficient $|k'|$ for $C_f$, $C_v$, and $C_y'$ is calculated. From the simple computer program, a printout can be made giving $|1/k'|$ and $C_y'$ for each $C_f$, $C_v$ pair.

To make single H-network 40 shown in FIG. 4, a fixed capacitor value $C_f$ is selected to give $|k'|$ values that bracket the design range of the measured coupling factor $|k|$ of antenna coil assembly 10, over the range of the variable capacitor $C_v$. The design range for $|k'|$ must be both high enough and low enough to safely cover the probable values of $|k|$. The capacitor values calculated should be large enough to be practical and small enough to cause only a small shift between the tuning capacitance $C_y$ and the modified value $C_y'$. Typically, the design is made easier if the minimum trimmer capacitance $C_v(\min)$ is small. Thus, an air variable capacitor rather than a ceramic trimmer is preferred.

Single H-network 40 of FIG. 4 has a minimum k' value and, therefore, its connections may need to be reversed to reverse the polarity for proper coupling cancellation. One such reversing means is shown in FIG. 4 as element 41.

To obtain circuit parameter values for the reversible coupling cancellation network 50 of FIG. 5, the parameters of variable H-network 51 are chosen to provide a large coupling factor range. If the design range for k' is $\pm k_d$ then the following relationship is necessary:

$$|k_v(\max)| - |k_v(\min)| = 2 \cdot k_d \qquad (16)$$

To shift total coupling to a range centered on zero, fixed H-network 52 of reversible coupling cancellation network 50 in FIG. 5 is used having an opposite polarity of variable H-network 51 and has a coupling factor as follows:

$$|k_r| = \frac{|k_v(\max)| + |k_v(\min)|}{2}. \qquad (17)$$

With the two H-networks 51, 52, the range of the total coupling factor $k_t$ of network 50 is:

$$|k_v(\min)| - |k_r| < |k_t| < |k_v(\max)| - |k_r|, \qquad (18)$$

or, $$-k_d < k_t < +k_d, \qquad (19)$$

as desired.

To choose the desired capacitance values for network 50, the fixed capacitor value $C_f$ from the array of data discussed above is chosen to give a large enough difference between $|k_v(\max)| - |k_v(\min)|$. The same fixed capacitor value $C_f$ is used in both H-networks 51, 52 since the value $C_v$ required to obtain $k' = k_r$ is near the middle of the variable capacitor range used for the variable H-network 51. The capacitance value $C_{vr}$ is chosen to give $k' = k_r$.

Practical Considerations

For proper neutralization, the preamplifier tuning network that resonates each receiver coil $L_x$ and $L_y$ must balance the coil circuits, giving equal magnitude but opposite polarity voltages on the two receiver coil terminals with respect to ground.

Losses in the neutralization capacitors will degrade the Q factor of the resonant circuits of the MRI antenna coil assembly 10. If the neutralization capacitors are much smaller than the tuning capacitance, then the added tuning capacitance $C_t'$ will only be a small fraction of the total tuning capacitance $C_y$, and the losses will not be significant. However, low priced capacitors, such as silver mica or NPO disc ceramic, can have much lower Q's (by a factor of 10 to 50) than high quality capacitors used in better tuning networks. Thus, if the added capacitance $C_t'$ is more than 5%, for example, of the total tuning capacitance, the effect of the capacitor Q on the total circuit Q should be calculated before deciding on the appropriate type of capacitor to use. The air variable trimmer has a high enough Q but a ceramic trimmer may not. Similiar consideration should be given to the connecting wires and the circuit board for the coupling cancellation network.

For small values of $C_t'$, the tuning change should be small when adjusting the neutralization. Large values may cause a substantial detuning effect. The tuning/neutralization interaction is discussed below. Because of both detuning and Q problems, small values of neutralization capacitors should be used. The component that determines the overall magnitude of the capacitance values for the reversible networks shown in FIG. 5 is the trimmer capacitor $C_v$ and, especially, the minimum value of that trimmer capacitor. Using small minimum trimmer values allows the use of relatively small fixed capacitors $C_f$ for a given neutralization factor $k'$.

Neutralization Adjustment

To adjust the coupling cancellation network, the above described Cricket can be used. The polarization of the magnetic field generated by the Cricket is rotated by mechanically rotating the Cricket in the antenna coil assembly volume about the axis of a receiver coil. Note that care must be taken to avoid coupling between the Cricket circuit and the coil. The coupling is between the reactive elements of the two circuits, such as the loop antenna of the Cricket and the coil and does not depend on the actual power level. The power level, that is, the loop current of the Cricket, determines the preamp output of the channel being studied in the antenna coil assembly. To test for any such interaction with the Cricket, a spectrum analyzer can be used to sweep through the resonance curve of the coil and preamplifier while driving the coil with a loosely coupled probe coil. The resonance curves should be identical with and without the Cricket. There will be an additional spike at the Cricket frequency when the Cricket is powered.

Before adjusting the coupling cancellation network, the two receiver coils $L_x$, $L_y$ must be tuned. With the selected coupling cancellation network 20, 40 or 50 connected across the coils, the entire antenna coil assembly 10 with coupling cancellation network is installed in the MRI system's gantry. The Cricket is mounted at the center of the antenna coil assembly volume between the receiver coils in a fixture that allows careful rotation about the chosen coil axis. Both coils are excited with the Cricket halfway between the X and Y axes. Each of the coil circuits is tuned for maximum output in response to the Cricket.

After tuning the X and Y channels to the Cricket's frequency, the neutralization coupling factor $k'$ of the chosen coupling cancellation network can be adjusted. The Cricket is rotated to find the minimum response for channel X. With the Cricket circuit rotated for minimum channel X response, the neutralization trimmer capacitor $C_v$ in FIG. 5, for example, is adjusted to make channel X's minimum as small as possible. With this position and trimmer setting, the ratio between the preamp outputs is measured. This rejection ratio $|V_y(\max)|/|V_x(\min)|$ should be greater than 30 dB. The Cricket is then carefully rotated to the minimum position for channel Y and the rejection ratio $|V_x(\max)|$ between channel X and channel Y for that position is noted.

As discussed above, since coupling is not exactly symmetric, the two rejection ratios will, most likely, not be equal. Since the system was adjusted for a minimum for channel X, channel Y will probably have the lower rejection ratio. The channel with the lower rejection ratio is chosen, and the Cricket is rotated to the minimum position for that channel. The neutralization trimmer capacitor $C_v$ is then readjusted to improve the rejection ratio to an intermediate value between the two ratios obtained in the first two tests.

When adjusting for neutralization, the maximum value on the other channel should not change to any significant degree; only the channel being minimized changes significantly. This compromise neutralization setting will give approximately equal rejection ratios for channel X and channel Y. If, however, the rejection ratios are not better than 30 dB for both channels, the adjustment procedure should be repeated.

It must be noted that measuring the rejection ratio after adjusting the neutralization capacitor $C_v$ requires very careful rotation of the Cricket to find the narrow polarization null, that is, the minimum response. A maximum response on the other channel is much wider with respect to the Cricket's azimuthal angle.

There is a slight interaction between neutralization capacitor $C_v$ and the preamp tuning, but the neutralization capacitor should not need to be readjusted when the tuning is changed. To test for this, the Cricket is rotated back to the position to excite both channels equally. Then the two channels are tuned again for maximum response. If either tuning adjustment is large, the Cricket must be rotated again and polarization rejection ratios checked to determine if they are larger than 30 dB. Otherwise, the neutralization should be readjusted.

When neutralizing an MRI antenna coil assembly for the first time, the total coupling including the incorrectly adjusted neutralization may be very large. In this case, it will not be possible to find a minimum response at a Cricket position near 45°. Instead, the two resonant circuits will be so strongly coupled that they both have maxima and minima at the same positions, near 0° and 90°. This situation makes the neutralization adjustment quite difficult.

For the initial adjustment under these circumstances, the Q of the resonances should be lowered to give their value of $|k \cdot Q|$ much less than 1 by connecting a resistor in parallel with each receiver coil. With the Q reduced to approximately 10 or 20, the minimum response position should be near 45°, and the tuning will be very broad. The neutralization can be adjusted with the resistors in place. When the resistors are removed, the neutralization should be approximately correct, and the final adjustment can be done with the high Q value.

Periodically, the neutralization can be checked to determine the need for readjustment. To check the neutralization, phantom scans are made with the "correct" and "reverse" connections between the preamps and the quadrature system. With good neutralization, the rejection of the counter-rotating polarization will be at least 20 dB. That is, the ratio of the mean image values for the two cases should be greater than 10:1 with approximately equal noise values.

Component Value Changes

If the setup procedure is successful, the two channels X and Y will show strong linear polarization. A response on each channel will show a large rejection ratio between the maximum and minimum responses of at least 30 dB. The minimum source positions for the two channels will be at 90° with respect to each other and at approximately 45° to the transmit coil axis.

If, however, the coupling cancellation network is not "strong" enough, the polarization will suffer. In such a situation, a redesign of the circuit parameter values of the coupling cancellation network may be necessary. For a total redesign, the coupling factor k should be remeasured as described above and calculations for circuit parameter values be made to give a more conservative design value $k_d$ for the desired neutralization coupling factor. If the same variable capacitor $C_v$ is used, then a higher value $k_d$ will require larger fixed capacitors $C_f$.

It may occur that the coupling cancellation network is almost "strong" enough so that the desired polarization is almost obtained at either the maximum or minimum setting of the neutralization trimmer $C_v$. In this case, with the use of dual H-network coupling cancellation network 50 of FIG. 5, a simple change to the network may suffice. The polarity of the neutralization network can be determined from whether the trimmer $C_v$ is at a maximum or minimum. If the trimmer $C_v$ is at a minimum value, then the required coupling polarity is through the variable side of the neutralization network, that is, through variable H-network 51, and the fixed side (from H-network 52) is in the opposite direction. The maximum coupling can then be extended in the desired direction by decreasing the strength of fixed side H-network 52. The simplest way to decrease the strength of the fixed side is to increase the value of the fixed capacitor $C_{vr}$. One value to be considered for the new $C_{vr}$ is the maximum trimmer capacitance on $C_v$.

When the neutralization is almost correct with the trimmer $C_v$ at a maximum value, the required coupling polarity is through the fixed side network 52, and the variable side network 51 is too "strong". To increase the coupling to the fixed side network 52, the value of $C_{vr}$ is decreased. One such new value of $C_{vr}$ to consider is the minimum capacitance value of trimmer capacitor $C_v$.

After accomplishing one of the two simple changes above, the coupling cancellation network will no longer be symmetric. However, since the polarity of the external, undesired coupling is not likely to change, this should cause no serious problems. The strength of the coupling in the required direction can still be adjusted. If one of the two simple changes is not sufficient, then the coupling cancellation network parameters should be redesigned after a careful coupling measurement k of the MRI antenna coil assembly is made.

It will be apparent to those skilled in the art that various modifications and variations can be made in the coupling cancellation network of the present invention without departing from the scope or spirit of the invention. For example, the fixed capacitors $C_f$ in the single H-network can be variable and the variable capacitor $C_v$ can be a fixed value. Also, in the double H-network, both H-networks can be variable ones. Thus, it is intended that the present invention covers the modifications and variations of this invention provided they come within the scope of the appended claims and their equivalents.

What is claimed:

1. In a quadrature antenna coil assembly of a magnetic resonance imaging system, the antenna coil assembly having a first receiver coil and a second receiver coil and having external coupling between the first and second receiver coils, a coupling cancellation network comprising:
   a first set of terminals connected across the first receiver coil and having a first terminal and a second terminal;
   a second set of terminals connected across the second receiver coil and having a first terminal and a second terminal;
   means, connected between the first and second terminal sets, for generating additional coupling between the first and second receiver coils in opposite polarity and equal magnitude to the external coupling, said additional coupling generating means comprising a first capacitance connected between the first terminals of the first and second terminal sets and a second capacitance connected between the second terminals of the first and second terminal sets; and means for reversing the connection of the first and second terminals of the first set of terminals to the first receiver coil.

2. The coupling cancellation network of claim 1 further comprising means for reversing the connection of the first and second terminals of the second set of terminals to the second receiver coil.

3. In a quadrature antenna coil assembly of a magnetic resonance imaging system, the antenna coil assembly having a first reciever coil and a second receiver coil and having external coupling between the first and second receiver coils, a coupling cancellation network comprising:
 a first set of terminals connected across the first receiver coil and having a first terminal and a second terminal;
 a second set of terminals connected across the second receiver coil and having a first terminal and a second terminal;
 means, connected between the first and second terminal sets, for generating additional coupling between the first and second receiver coils in opposite polarity and equal magnitude to the external coupling, said additional coupling generating means comprising an H-network having two first capacitors in series between the first terminals of the first and second sets of terminals, two second capacitors in series between the second terminals of the first and second sets of terminals, and a variable capacitor connected between the common connection of the two first capacitors and the common connection of the two second capacitors.

4. The coupling cancellation network of claim 3 further comprising means for reversing the connection of the first and second terminals of the first set of terminals to the first receiver coil.

5. The coupling cancellation network of claim 3 further comprising means for reversing the connection of the first and second terminals of the second set of terminals to the second receiver coil.

6. In a quadrature antenna coil assembly of a magnetic resonance imaging system, the antenna coil assembly having a first receiver coil and a second receiver coil and having external coupling between the first and second receiver coils, a coupling cancellation network comprising:
 a first set of terminals connected across the first receiver coil and having a first terminal and a second terminal;
 a second set of terminals connected across the second receiver coil and having a first terminal and a second terminal;
 means, connected between the first and second terminal sets, for generating additional coupling between the first and second receiver coils in opposite polarity and equal magnitude to the external coupling, said additional coupling generating means comprising means for generating an adjustable coupling of a first polarity comprising a first H-network having two first capacitors in series with the first terminal of the first set of terminals and the second terminal of the second set of terminals, two second capacitors in series between the second terminal of the first set of terminals and the first terminal of the second set of terminals, and a variable capacitor connected between the common connection of the two first capacitors and the common connection of the two second capacitors; and said additional coupling generating means further comprising
 means for generating a fixed coupling of a second polarity comprising a second H-network having two first capacitors in series between the first terminals of the first and second sets of terminals, two second capacitors in series between the second terminals of the first and second sets of terminals, and a fixed capacitor connected between the common connection of the two first capacitors and the common connection of the two second capacitors,
 wherein the adjustable coupling generating means and the fixed coupling generating means are connected to combine the algebraic sum of the adjustable and the fixed generated coupling for producing the additional coupling at the first and second sets of terminals that can be varied over a range from negative coupling to positive coupling.

7. In a quadrature antenna coil assembly of a magnetic resonance imaging system, the antenna coil assembly having a first receiver coil and a second receiver coil and having external coupling between the first and second receiver coils, a coupling cancellation network comprising:
 a first set of terminals connected across the first receiver coil and having a first terminal and a second terminal;
 a second set of terminals connected across the second receiver coil and having a first terminal and a second terminal; and
 means, connected between the first and second terminal sets, for generating additional coupling between the first and second receiver coils and for adjusting the generated additional coupling to a magnitude equal to the external coupling and in the opposite polarity of the external coupling, said additional coupling generating and adjusting means comprising
 a first variable capacitance connected between the first terminals of the first and second terminal sets, a second variable capacitance connected between the second terminals of the first and second terminal sets, and means for reversing either the connection of the first and second terminals of the first set of terminals to the first receiver coil or the connection of the first and second terminals of the second set of terminals of the second receiver coil.

8. The coupling cancellation network of claim 7 wherein the first and second variable capacitances comprise an H-network having two first capacitors in series between the first terminals of the first and second sets of terminals, two second capacitors in series between the second terminals of the first and sets of terminals, and a variable capacitor connected between the common connection of the two first capacitors and the common connection of the two second capacitors.

9. In a quadrature antenna coil assembly of a magnetic resonance imaging system, the antenna coil assembly having a first receiver coil and a second receiver coil and ahving external coupling between the first and second receiver coils, a coupling cancellation network comprising:
 a first set of terminals connected across the first receiver coil and having a first terminal and a second term:inal;
 a second set of terminals connected across the second receiver coil and having a first terminal and a second terminal; and means, connected between the first and second terminal sets, for generating additional coupling between the first and second receiver coils and for adjusting the generated additional coupling to a magnitude equal to the external coupling and in the opposite polarity of the external coupling, said additional coupling generating and adjusting means comprising means for generating an adjustable coupling of a first polarity, means for generating a fixed coupling of a second polarity, and means for connecting the adjustable coupling generating means and the fixed coupling generating means to combine the algebraic sum of the adjustable and the fixed generated coupling for producing the additional coupling at the first and second sets of terminals that can be varied over a range from negative coupling to positive coupling.

10. The coupling cancellation network of claim 9 wherein the adjustable coupling generating means comprises:

a first H-network having two first capacitors in series between the first terminal of the first set of terminals and the second terminal of the second set of terminals, two second capacitors in series between the second terminal of the first set of terminals and the first terminal of the second set of terminals, and a variable capacitor connected between the common connection of the two first capacitors and the common connection of the two second capacitors; and the fixed coupling generating means comprises:

a second H-network having two first capacitors in series between the first terminals of the first and second sets of terminals, two second capacitors in series between the second terminals of the first and second sets of terminals, and a fixed capacitor connected between the common connection of the two first capacitors and the common connection of the two second capacitors.

11. In a quadrature antenna coil assembly of a magnetic resonance imaging system, the antenna coil assembly having a first receiver coil and a second receiver coil and having external coupling between the first and second receiver coils, a coupling cancellation network comprising:

a first set of terminals connected across the first receiver coil and having a first terminal and a second terminal;

a second set of terminals connected across the second receiver coil and having a first terminal and a second terminal; and means, connected between the first and second terminal sets, for generating additional coupling between the first and second receiver coils in opposite polarity and equal magnitude to the external coupling, said additional coupling generating means comprising means for generating an adjustable coupling of a first polarity and means for generating an adjustable coupling of a second polarity, wherein the two adjustable coupling generating means are connected to combine the algebraic sum of the two adjustable generated couplings for producing the additional coupling at the first and second sets of terminals that can be varied over a range from negative coupling to positive coupling.

12. The coupling cancellation network of claim 11 wherein the first adjustable coupling generating means comprises:

first H-network having two first capacitors in series with the first terminal of the first set of terminals and the second terminal of the second set of terminals, two second capacitors in series between the second terminal of the first set of terminals and the first terminal of the second set of terminals, and a variable capacitor connected between the common connection of the two first capacitors and the common connection of the two second capacitors; and the second adjustable coupling generating means comprises:

a second H-network having two first capacitors in series between the first terminals of the first and second sets of terminals, two second capacitors in series between the second terminals of the first and second sets of terminals, and a variable capacitor connected between the common connection of the two first capacitors and the common connection of the two second capacitors.

13. In a quadrature antenna coil assembly of a magnetic resonance imaging system, the antenna coil assembly having a first receiver coil and a second receiver coil and having external coupling between the first and second receiver coils, a coupling cancellation network comprising:

a first set of terminals connected across the first receiver coil and having a first terminal and a second terminal;

a second set of terminals connected acrosss the second receiver coil and having a first terminal and a second terminal; and means, connected between the first and second terminal sets, for generating additional coupling between the first and second receiver coils and for adjusting the generated additional coupling to a magnitude equal to the external coupling and in the opposite polarity of the external coupling, said additional coupling generating and adjusting means comprising first means for generating an adjustable coupling of a first polarity, second means for generating a fixed coupling of a second polarity, and means for connecting the first adjustable coupling generating means and the second fixed coupling means to combine the algebraic sum of the first adjustable and second fixed generated coupling for producing the additional coupling at the first and second sets of terminals that can be varied over a range from negative coupling to positive coupling.

* * * * *